United States Patent
Ido

(10) Patent No.: US 10,566,962 B2
(45) Date of Patent: Feb. 18, 2020

(54) PULSE-WIDTH MODULATION

(71) Applicant: Cirrus Logic International Semiconductor Ltd., Edinburgh (GB)

(72) Inventor: Toru Ido, Yokohama (JP)

(73) Assignee: Cirrus Logic, Inc., Austin, TX (US)

( * ) Notice: Subject to any disclaimer, the term of this patent is extended or adjusted under 35 U.S.C. 154(b) by 81 days.

(21) Appl. No.: 15/916,708

(22) Filed: Mar. 9, 2018

(65) Prior Publication Data

US 2019/0103862 A1 Apr. 4, 2019

Related U.S. Application Data

(60) Provisional application No. 62/566,672, filed on Oct. 2, 2017.

(51) Int. Cl.
*H03K 7/08* (2006.01)
*H03F 3/217* (2006.01)
*H03M 1/82* (2006.01)

(52) U.S. Cl.
CPC ............... *H03K 7/08* (2013.01); *H03F 3/217* (2013.01); *H03F 3/2173* (2013.01); *H03M 1/822* (2013.01); *H03F 2200/03* (2013.01); *H03F 2200/351* (2013.01)

(58) Field of Classification Search
CPC . H03K 7/08; H03F 2200/03; H03F 2200/351; H03F 3/217; H03F 3/2173; H03M 1/822
See application file for complete search history.

(56) References Cited

U.S. PATENT DOCUMENTS

| | | | | |
|---|---|---|---|---|
| 5,148,168 A | * | 9/1992 | Masuda | H03M 1/822 327/172 |
| 7,180,365 B2 | * | 2/2007 | Lee | H03F 3/217 330/10 |
| 10,044,326 B2 | * | 8/2018 | Chang | H03F 3/187 |
| 2005/0040980 A1 | | 2/2005 | Miller | |
| 2005/0212576 A1 | | 9/2005 | Shinohara | |

(Continued)

OTHER PUBLICATIONS

International Search Report and Written Opinion of the International Searching Authority, International Application No. PCT/GB2018/052745, dated Dec. 12, 2018.

*Primary Examiner* — Ryan Johnson
(74) *Attorney, Agent, or Firm* — Jackson Walker L.L.P.

(57) ABSTRACT

This application relates to digital PWM modulation. A PWM modulator (400, 1100) has a PWM generator (402) configured to receive pulse width data ($P_{Width}$) and to output a PWM signal ($S_{PWM}$) comprising a plurality of repeating PWM cycle periods, in which the duration of any pulse of the PWM signal in each PWM cycle period is based on the pulse width data. The PWM generator is configured to synchronise the PWM cycle periods, and the start and end of any PWM pulse, to a received first clock signal. The PWM generator is operable to generate pulses that have a positional error from a centred position within the PWM cycle period and a pulse position controller (403) is configured to control the position of a pulse in a PWM cycle period so as to at least partly compensate for the positional error of one or more preceding pulses.

19 Claims, 6 Drawing Sheets

(56) References Cited

U.S. PATENT DOCUMENTS

2006/0158359 A1    7/2006  Magrath
2007/0176660 A1    8/2007  Andersen et al.
2013/0241663 A1*  9/2013  Ding ........................ H03K 7/08
                                                            332/109

* cited by examiner

PULSE-WIDTH MODULATION

FIELD

This application relates to method and apparatus for pulse-width modulation.

BACKGROUND

Pulse-width modulation (PWM) is a known type of modulation in which, typically, a signal cyclically alternates between two output states and signal values are encoded by the duration or width of pulses of different output states in each cycle. The signal value is typically encoded as the relative duration of a pulse of, say, a first state compared either to the duration of a pulse of a second state in the cycle or to the total cycle period. In some types of PWM the cycle period may be constant from one cycle to the next, i.e. there is a fixed cycle frequency.

PWM modulators may be used in a variety of applications. One particular application is as use of part of a signal path for converting a digital signal into an analogue signal, for example as part of an audio playback path for converting a digital audio signal into an analogue audio signal suitable for driving an audio transducer.

Conventionally, audio playback paths have been implemented using a suitable digital-to-analogue converter (DAC) implemented using analogue circuitry, e.g. a switched capacitor DAC or similar, to convert an input digital audio signal into an analogue signal. The analogue signal can be then be buffered or amplified as required, e.g. using any suitable amplifier such as class-AB type amplifier or an analogue-input Class-D type amplifier.

Increasingly however there is a trend to integrated circuits being implemented using smaller process node geometries. For such smaller process node geometries, analogue circuitry may present certain design challenges and may not scale well in terms of size and power requirements. Thus there is often a desire to implement as much circuitry as digital circuitry where possible.

Digital PWM generators can be used together with a Class-D output stage to provide a signal path that is predominantly digital and thus can be efficiently implemented on smaller process node geometries. The timing of edges of pulses is defined by a digital word and is quantised to edges of a fast clock. However digital PWM generation can require fast clock speeds to avoid distortion associated with the quantisation of the pulse position.

EXAMPLE EMBODIMENTS OF THE PRESENT DISCLOSURE

Embodiments described in this disclosure relate to digital PWM modulators and to methods and apparatus for digital PWM that at least mitigate at least some of these issues.

Thus according to one aspect of the present disclosure there is provided a PWM (pulse-width-modulation) modulator comprising:
- a PWM generator configured to receive pulse width data and to output a PWM signal comprising a plurality of repeating PWM cycle periods, in which the duration of any pulse of the PWM signal in each PWM cycle period is based on the pulse width data,
- wherein the PWM generator is configured to receive a first clock signal and to synchronise the PWM cycle periods and the start and end of any pulse of the PWM signal to the first clock signal;
- wherein the PWM generator is operable to generate pulses that have a positional error from a centred position within the PWM cycle period; and
- wherein the pulse-width modulator comprises a pulse position controller configured to control the position of a pulse in a PWM cycle period so as to at least partly compensate for the positional error of one or more preceding pulses.

In some implementations the pulse position controller may be configured to receive the pulse width data and may comprise: an error block for determining a positional error for a pulse based on the pulse width data; a loop filter for filtering the positional error; and a quantizer configured to output pulse position data for the controlling the position of the pulse in the PWM cycle period based on the output of the loop filter. The pulse position data may comprise data indicating a shift in pulse position from the centred position within the PWM cycle period. The error block may comprise a multiplier for multiplying a feedback signal of the pulse position data with the pulse width data to generate the positional error. The pulse position controller may further comprise a gain compensation block configured to apply gain compensation to the output of the loop filter to compensate for the variable pulse width. The gain compensation block may comprise a store of a set of reciprocal values proportional to the reciprocals of the possible pulse widths and the gain compensation block may be configured to multiply the output of the loop filter with an appropriate reciprocal value based on the pulse width data. The loop filter may comprise a second or higher order integrating filter. The quantizer may be configured to select from a first set of output values when the pulse width data is odd and select from a second set of output values when the pulse width data is even. One of the first and second set of output values may comprise a set of integers and the other of the first and second set of output values comprises a set of half-integers. The pulse position controller may comprise a parity monitor for determining whether the pulse width data is odd or even from a least significant bit of the pulse width data wherein the quantizer is responsive to the parity monitor. The quantizer may comprise a first and second quantizers for operating with said first and second sets of output values respectively and one of the first and second quantizers may be selected to output the pulse position data based on the parity of the pulse width data. The pulse position controller may further comprise a saturation controller configured to apply a limit to the output of the quantizer based on the pulse width data so as to limit the start and end of the pulse within the PWM cycle period.

In some implementations the pulse position controller may be configured to output pulse position data to the PWM generator. The PWM generator may be configured to generate the pulse in the PWM cycle period at a position based on the pulse position data and for a duration based on the pulse width data. The PWM modulator may comprise: a threshold generator for generating first and second threshold values based on the pulse width data and the pulse position data; a counter clocked by said first clock signal to generate a count value; and at least one comparator responsive to said first and second threshold values and said count value to determine when to start and stop a pulse within the PWM cycle period. The pulse position data may comprise an indication of a shift of the pulse from a centred position in the PWM cycle period. The threshold generator may be configured to generate initial values of said first and second threshold values based on the pulse width data for a pulse in a centred position and to adjust said initial values of said first and second threshold values based on the pulse position data. The counter may be configured to reset after counting for a number of clock cycles of the first clock signal corresponding to the PWM cycle period.

In some implementations the PWM modulator may further comprise a signal converter for receiving an input signal and converting the input signal to said pulse width data. The signal converter may comprise a sigma delta modulator.

In some embodiments the PWM modulator may be configured to output first and second PWM signals, e.g. as a differential output, for example for driving a full-bridge class-D amplifier output stage. In some embodiments the PWM modulator may comprise circuitry for receiving the PWM signal from the PWM generator and deriving first and second PWM signals providing a differential output.

In some instances the second PWM signal may be an inverted version of the first PWM signal, e.g. to provide AD type modulation. In which case the PWM signal which is output from the PWM generator may be output as the first PWM signal and the PWM modulator may comprise an inverter for inverting a version of the PWM signal output from the PWM generator to provide the second PWM signal.

In other embodiments the first and second PWM signals may be generated so as to allow for zero states in the differential output, e.g. BD type modulation. In some embodiments the PWM modulator may comprise a remodulator configured to convert the PWM signal output from the PWM generator into a three state signal. The remodulator, may, in some instances, comprise a comb filter, for example comprising a delay and combiner. The PWM modulator may further comprise a mapper for mapping the three state signal into the first and second PWM signals.

In some embodiments the PWM generator may be configured to generate the first and second PWM signals and the pulse position controller may be configured to control the position of pulses in the first and second PWM signals. In some embodiments the PWM generator is configured to receive first and second pulse width data and to output respective first and second PWM signals. A processing block may be configured to receive an initial pulse width signal, e.g. from a sigma-delta modulator, and determine the first and second pulse width data. In some embodiments the error block discussed above may be configured to determine pulse positional error based on the first width data and the second pulse width data and the quantizer may be a vector quantizer configured to output first pulse position data for the controlling the position of a pulse in the PWM cycle period of the first PWM signal and second pulse position data for the controlling the position of a pulse in the PWM cycle period of the second PWM signal.

The PWM modulator may be implemented as an integrated circuit. The PWM modulator may, in some implementations, be formed as part of a signal path for driving a transducer. The transducer may be one of an audio transducer; an ultrasonic transducer; a haptic transducer.

Aspects also relate to a Class-D amplifier circuit comprising a PWM modulator as described in any of the variants above and an output stage controlled by the PWM signal. The output stage may be a half-bridge or a full-bridge output stage. Where the output stage is full-bridge output stage and the PWM modulator does not itself output first and second PWM signals suitably for driving the full bridge output stage, the amplifier circuit may comprise circuitry for receiving the PWM signal and deriving first and second PWM signals for driving first and second branches of a full-bridge output stage respectively, such as an inverter or re-modulator and mapper as discussed above.

Aspects also relate to an electronic device comprising a PWM modulator as described in any of the variants above or a Class-D amplifier circuit as described. The device may be at least one of: a portable device; a battery powered device; a communication device; a mobile or cellular telephone or smartphone; a computing device; a laptop, notebook or tablet computing device; a wearable device; a smartwatch; a voice controlled or activated device; a media player; a gaming device; a domestic device or appliance.

Aspects also relate to method of PWM modulation comprising:
  generating a PWM signal comprising a plurality of repeating PWM cycle periods, in which the duration of any pulse of the PWM signal in each PWM cycle period is based on received pulse width data such that the PWM cycle periods and the start and end of any pulse of the PWM signal are synchronised to a received first clock signal;
  wherein the method comprises generating pulses that have a positional error from a centred position within the PWM cycle period and controlling the position of a pulse in a PWM cycle period so as to at least partly compensate for the positional error of one or more preceding pulses.

Aspects also relate to a PWM modulator comprising: an input for receiving an input signal; a clock input for receiving a first clock signal; and a pulse generator for generating pulses in PWM cycle periods wherein the pulses and the PWM cycle periods are synchronised to the first clock signal and duration of a pulse in a PWM cycle period is controlled based on the input signal; wherein the pulse generator is operable to generate pulses that are not centred within a PWM cycle period and the position of a pulse in a PWM cycle period is controlled so as to compensate for non-centred pulses in one or more previous PWM cycle periods.

Aspects also relate to a PWM modulator operable to generate a digital PWM signal wherein signal transitions in the PWM signal are synchronised to a first clock signal, wherein the PWM modulator comprises a pulse position controller configured to monitor any positional error arising from pulses in a PWM cycle period not being centred within the PWM cycle period and to control the position of a pulse in a subsequent PWM cycle period to compensate for said error.

Aspects also relate to a pulse position controller for controlling the position of a pulse of a PWM signal in a PWM cycle period, the pulse position controller being configured to receive pulse width data and comprising: an error block for determining a positional error for a pulse based on the pulse width data; a loop filter for filtering the positional error; and a quantizer configured to output pulse position data for the controlling the position of the pulse in the PWM cycle period based on the output of the loop filter.

Aspects also relate to digital PWM pulse generator comprising:
  a first input for receiving pulse width data; a second input for receiving pulse position data; a clock input for receiving a first clock signal; an output for outputting a PWM signal comprising a series of pulses in PWM cycle periods, where PWM cycle period and the start and end of the pulses are synchronised to the first clock signal; wherein the duration of a pulse in a PWM cycle period is defined by the pulse width data and the position of the pulse in the PWM cycle period is defined by the pulse position data.

The digital PWM pulse generator may comprise: a threshold generator for generating first and second threshold based on said pulse width data and said pulse position data; a counter clocked by said first clock signal to generate a count value; and at least one comparator responsive to said first and second threshold values and said count value to determine when to start and stop a pulse within the PWM cycle period.

BRIEF DESCRIPTION OF THE DRAWINGS

To better explain and illustrate aspects of the present disclosure, various embodiments will now be described, purely by way of example only, with reference to the accompanying drawings, of which.

DETAILED DESCRIPTION

Figure 1:
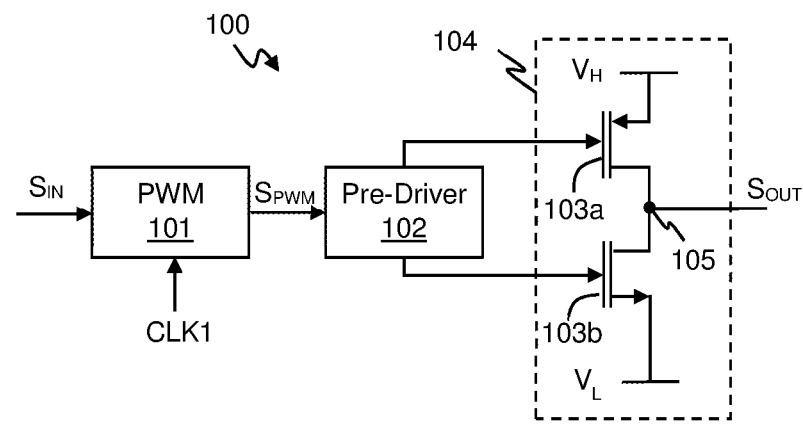
FIG. 1 illustrates one example of a Class-D amplifier.

As mentioned above one application of digital PWM modulators is for Class-D amplifiers. FIG. 1 illustrates the principle of a digital PWM Class-D amplifier circuit 100. A digital input signal $S_{IN}$ is received by a PWM modulator 101 which generates a corresponding PWM signal $S_{PWM}$. The PWM signal $S_{PWM}$ encodes the value of the input signal $S_{IN}$ as the duration of pulses of a first output state, e.g. logic 1, in defined PWM cycle periods of cycle frequency $F_{CYC}$.

The PWM signal $S_{PWM}$ is received by a pre-driver 102 that drives switches 103a and 103b of output stage 104 in anti-phase based on the PWM signal $S_{PWM}$ (typically with a small dead-time during switch transitions to avoid current shoot-through). The switches 103a and 103b are connected in series between high and low voltage rails $V_H$ and $V_L$ and an output signal $S_{OUT}$ is tapped from output node 105 at a midpoint between the switches 103a and 103b. The output signal $S_{OUT}$ in the example of FIG. 1 is thus a rail-to-rail output that varies between $V_H$ and $V_L$ according to the PWM signal $S_{PWM}$. The average voltage of the output signal $S_{OUT}$ depends on the duty cycle of the PWM signal $S_{PWM}$. The output signal $S_{OUT}$ can be filtered by downstream filter components, that may include an audio load for example, to provide an analogue driving signal. Note that FIG. 1 illustrates a half-bridge output stage, e.g. suitable for driving a single-ended load but in some instance a full-bridge output stage may be used, as will be described in more detail below.

For a digital PWM modulator 101 the signal transitions of the PWM signal $S_{PWM}$ are synchronised to a first clock signal CLK1 of frequency $F_{CLK1}$. The durations of each pulse of the PWM signal $S_{PWM}$, and the PWM cycle period itself, are thus multiples of the period $T_{CLK1}$ of a clock cycle of the first clock signal CLK1. The cycle frequency $F_{CYC}$ of the PWM modulator 101 effectively defines what can be seen as a sample rate of the output signal $S_{OUT}$ prior to filtering and may be chosen so as to provide a desired overall performance for the amplifier 100. The clock frequency $F_{CLK1}$ of the first clock signal CLK1 may be chosen such that there are a sufficient number of clock cycles within the PWM cycle period to provide a desired resolution, in terms of the number of different possible pulse widths available to encode the input signal. Thus the frequency of the first clock signal $F_{CLK1}$ may be set to be equal to $N*V_{CYC}$ where N is the desired resolution. For instance if the cycle period corresponded to 30 clock cycles of the first clock signal CLK1, then 31 different values of duty cycle could be encoded—assuming that duty cycles of 0%, i.e. no pulse of the first state during the cycle, and 100%, i.e. a pulse of the first state for the whole of the PWM cycle period, are allowed.

The input signal $S_{IN}$ defines the duration of the pulse of the first state. In some instances the input signal may be an appropriate digital signal that natively defines the required pulse width, in terms of the number of clock cycles of the first clock signal CLK1. For instance the input signal $S_{IN}$ may be a digital signal with a resolution N that matches that of the PWM modulator 101. For instance, for the example described above having 31 different pulse widths (including a pulse width of zero) the input signal $S_{IN}$ could be a suitable 5-bit digital signal at a sample rate corresponding to the cycle frequency $F_{CYC}$. In some implementations however the input signal $S_{IN}$ may need to be converted into a suitable format, e.g. such as 5-bit digital signal at a sample rate corresponding to the PWM cycle frequency $F_{CYC}$ by a suitable converter, such as a delta-sigma modulator, as will be discussed in more detail later.

The PWM modulator 101 thus generates a pulse of the first state for a number of contiguous clock cycles of the first clock signal CLK1 as defined by the input signal. The output of the PWM modulator 101 can be seen as a digital signal at a sample rate defined by the first clock signal CLK1, where a certain number of successive bits within a PWM cycle period are 1 and the remaining bits in the PWM cycle period are 0 (or vice versa).

Figure 2:
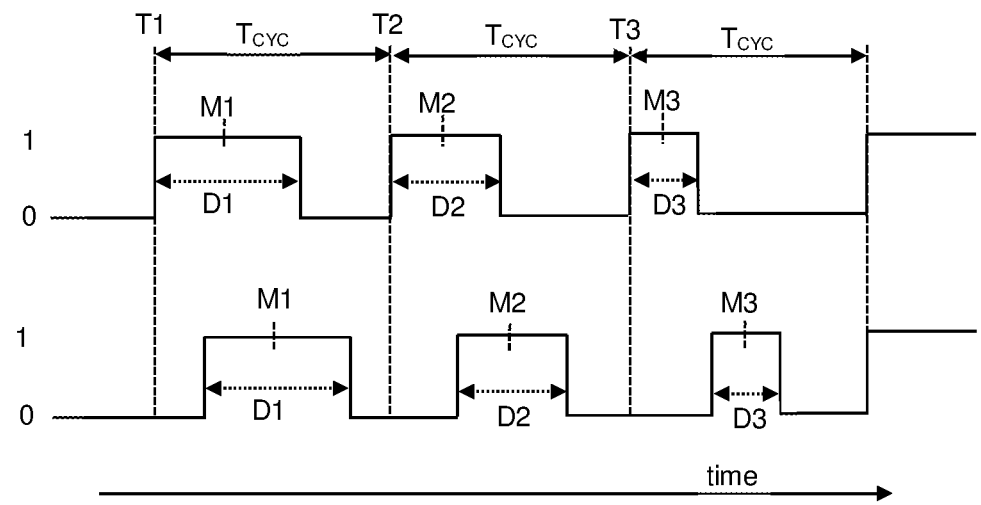
FIG. 2 illustrates different formats of PWM signal.

There are various different formats for a PWM signal. For example FIG. 2 illustrates two examples of PWM signals. In each case there is a fixed PWM cycle period $T_{CYC}$ and FIG. 2 illustrates three PWM cycle periods, starting at T1, T2 and T3 respectively. In each case the PWM signal varies between a first state (e.g. logic 1) and a second state (e.g. logic 0) to define a single pulse of the first state in each PWM cycle period, with respective durations of D1, D2 and D3.

In the topmost signal illustrated in FIG. 2 the pulse of the first state is started at the beginning of the relevant PWM cycle period and the first state, logic 1, is maintained for the required duration. The signal then changes to the second state and maintains this state until the start of the next PWM cycle period, when it changes back to the first state (unless, if allowable, the next first state pulse is defined to be of zero length).

Whilst such a PWM signal may correctly encode the value of input signal $S_{IN}$ by the duty cycle in each PWM cycle period, a timing issue does arise if such a PWM signal is used for some applications which are sensitive to the distribution of energy within each PWM cycle of the PWM signal, for example if the PWM signal is converted to an analogue signal by filtering. For instance, if such a PWM signal were used to control a Class-D output stage, such as illustrated in FIG. 1, and such a Class-D output stage was connected between supply rails of $V_H$=VDD and $V_L$=ground, then the pulses of the PWM signal would define both the amount of time spent with the output connected to voltage of VDD and the timing thereof. Each PWM cycle period of the output signal $S_{OUT}$ can be seen as a sample period, where the value of the signal is encoded as the voltage-time product of the pulse within the sample period. When filtered this provides the desired analogue signal value. It will be appreciated that a sample value corresponding to the voltage-time product of a pulse is effectively centred on the centre or midpoint of the pulse. FIG. 2 also shows the respective midpoints M1, M2 and M3 of the pulses in each of the three cycle periods. It can be seen that the midpoint of the pulses are not aligned with the midpoint of the respective PWM cycle period and that as the pulse duration changes (reduces in this example) the position of the midpoint moves (further towards the start of the cycle in this example) and the time between the midpoints of successive pulses also varies. In effect this results in a timing or phase error than can result in distortion in the resultant filtered analogue signal.

Therefore for applications such as Class-D amplifiers where a PWM signal is effectively converted to analogue by filtering, the PWM signal is preferably arranged as a symmetric PWM signal, as illustrated by the lower signal in FIG. 2. For a symmetric PWM signal the midpoint of each pulse in each cycle is co-located with the midpoint of the cycle. Thus the pulse of the first state, e.g. D1, occurs over the middle part of the PWM cycle period, with equal periods of the second state occurring at the start and end of the PWM cycle period. Such a symmetric PWM signal can be converted to analogue without the timing error noted above.

For an analogue PWM modulator, the time of the start or end of the pulse of first state may not be significantly constrained, and thus a pulse of substantially any duration within the cycle period could be formed as part of a symmetric PWM signal, for instance by comparing the input signal, or an error signal derived from the input signal, to a sawtooth type waveform that symmetrically ramps from a first value to a second value then back to the first value over the course of the cycle period.

However as noted above for a digital PWM modulator the start and end of a pulse within the PWM cycle period are synchronised to the first clock signal. This can mean that some possible pulse widths cannot be correctly positioned so as to be symmetric about the midpoint of the PWM cycle period. As noted above the PWM cycle period may be defined to have a duration equal to N clock cycles of the first clock signal CLK1 and the beginning and end of a pulse within the PWM cycle period may synchronised to the first clock signal so that the pulse duration is also an integer number of clock cycles. If N is even, say a duration of 30 clock cycles as for the example discussed previously, then a pulse width of an odd number of clock cycles cannot be correctly positioned to be symmetric within the PWM cycle period.

Figure 3:
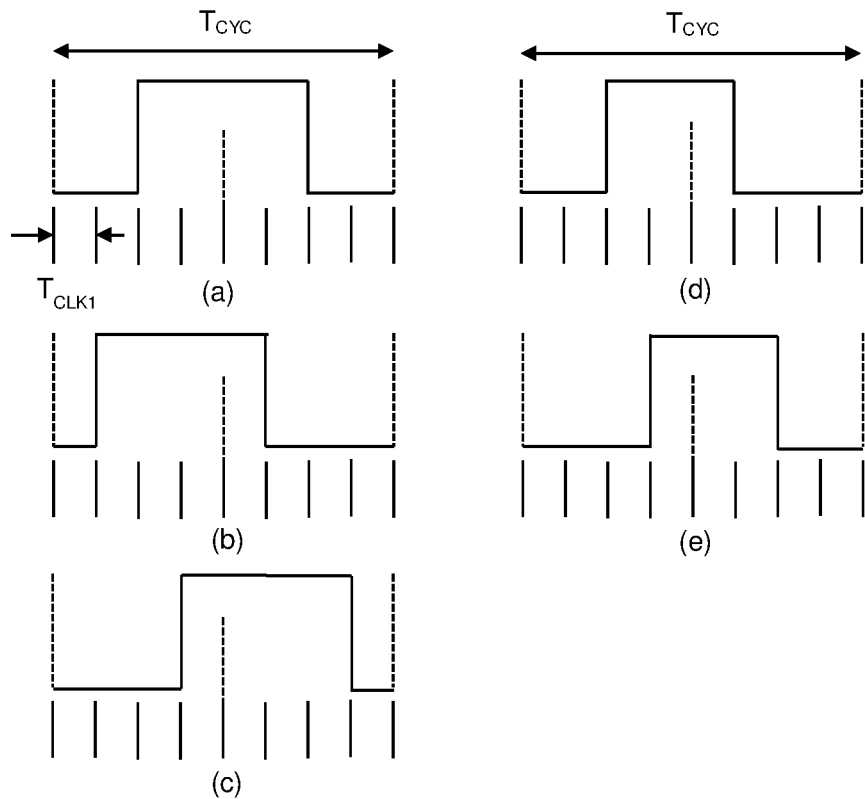
FIG. 3 illustrates a timing issue with digital PWM signals.

FIG. 3 illustrates this issue. FIG. 3 illustrates a PWM cycle period of duration $T_{CYC}$ which is this example is equal to 8 clock cycles of period $T_{CLK1}$ of the first clock signal CLK1. For this even number of clock cycles within the PWM cycle period, a pulse which has a duration that is also equal to an even number of clock cycles can be arranged to be symmetric as illustrated by position (a). It will be of course appreciated that a pulse that is an even number of clock cycles in duration could be positioned within the PWM cycle period so as to start early as illustrated by position (b). In this example there is only one clock cycle of the second state before the start of the pulse, but three clock cycles after the end of the pulse before the end of the PWM cycle period. This can be seen as a position error of one polarity, i.e. starting the pulse too early. Position (c) illustrates an error of the opposite polarity, i.e. starting the pulse too late.

However for a pulse with a duration equal to an odd number of clock cycles, it is not possible to correctly position the pulse within the PWM cycle period $T_{CYC}$ so as to be symmetric. The pulse will either start too early, as illustrated in position (d) where there are two clock cycles before the start of the pulse and three clock cycles after the end of the pulse before the end of the PWM cycle period—corresponding to an error in the time of starting the pulse of half a clock cycle—or too late, as illustrated in position (e) where again there is an error in timing of half a clock cycle.

It will be appreciated that a similar problem would exist if the PWM cycle period were to have a duration equal to an odd number of clock cycles $T_{CLK1}$. In that case it would be possible to arrange pulses symmetrically where the duration of the pulse is also an odd number of clock cycles, but a timing or phase error would always exist for a pulse having a duration which corresponds to an even number of clock cycles. In other words a pulse can be positioned centrally within the PWM period if the duration of the PWM period and the duration of the pulse, in terms of number of clock cycles, have the same parity, i.e. both even or both odd, but cannot be positioned centrally if the parity is different.

It would be possible to limit the digital PWM modulator 101 to only output pulses with a duration, in terms of number of clock cycles, of the same parity as the duration of the PWM cycle period, e.g. to only use pulses of an even number of clock cycles for a cycle period which is itself an even number of clock cycles. However this would limit the number of different pulse widths that could be produced. For example if the PWM cycle period has a duration equal to 30 clock cycles and the PWM modulator was limited to produce output pulses having durations equal to an even number of clock cycles only, then there would only be 15 different pulse widths that could be generated (or 16 including no pulse, i.e. a 0% duty cycle). This would thus reduce the resolution of the PWM signal with a consequent impact on performance. Alternatively, to maintain a desired resolution, the number of clock cycles within the PWM cycle period could be increased by using a first clock signal CLK1 at a higher frequency. For instance if the frequency of the first clock signal CLK1 were fast enough that there were 60 clock cycles in the required PWM cycle period, then the PWM modulator 101 could be arranged to output 30 different pulse widths, each of an even number of clock cycles. This would however require the frequency of the first clock signal CLK1 to be double what would otherwise be required to provide the required resolution. Such a fast clock frequency would have an impact on power efficiency.

Embodiments of the present disclosure thus relate to methods and apparatus for PWM modulation that at least mitigate some of these issues. In embodiments of the present disclosure a PWM modulator may operate to generate a PWM signal in which the position of a pulse within a PWM cycle period is controlled based, at least partly, on an indication of any positional error of one or more preceding pulses. In embodiments of the disclosure the PWM modulator may generate a PWM signal in which the PWM cycle period, and the position of pulses in the PWM cycle period, are defined by a first clock signal, i.e. the start and end of the pulse is synchronised to the first clock signal. The PWM signal may be generated where at least some pulses may include a positional error, e.g. are not centred or symmetric within the PWM cycle period, and where a subsequent pulse in a subsequent cycle period is positioned within the PWM cycle period to at least partly compensate for the positional error.

Figure 4:
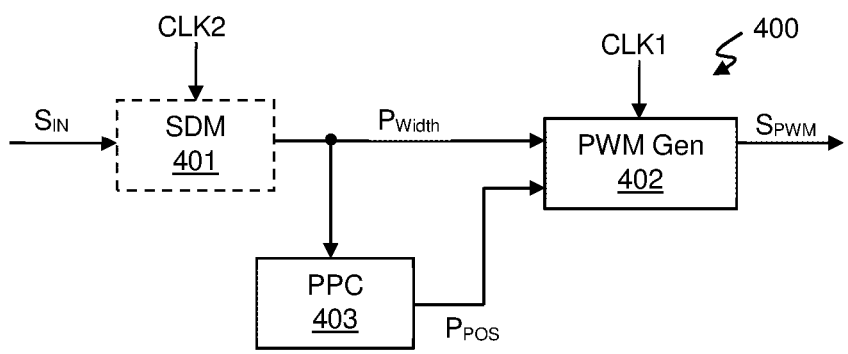
FIG. 4 illustrates a PWM modulator according to an embodiment.

FIG. 4 illustrates an embodiment of a PWM modulator 400 that could be used as a digital PWM modulator 101 in the circuit 100 of FIG. 1. In some implementations however the format (e.g. the bit-width or word length or sample frequency) of the received input signal may not be suitable for direct use as an indication of the required pulse width $P_{Width}$. FIG. 4 illustrates that the input signal $S_{IN}$ may, in some implementations be received by a word-length or sample rate converter module 401. For example the word length may be reduced by a sigma-delta modulator (SDM) 401. The shaping of quantisation noise in such a converter may provide better audio band quantisation noise than merely truncating the input digital words of input signal $S_{IN}$. The SDM 401 may convert the input signal $S_{IN}$ into a digital signal of the desired resolution N and at the required sample rate corresponding to the PWM cycle frequency $F_{CYC}$. The output from the SDM 401 is effectively an indication of the required pulse width $P_{Width}$ in each cycle period. The SDM 401 may thus operate at a frequency defined by a second clock signal CLK2 where the second clock signal CLK2 has a lower frequency than the first clock signal. The second clock signal CLK2 may have a frequency equal to $F_{CYC}$. In some instance the second clock signal CLK2 may be derived from the first clock signal CLK1.

In some implementations however the input signal $S_{IN}$ may be received in a suitable format, e.g. from some upstream processing or storage, and thus the input signal $S_{IN}$ could be used directly as the pulse width data $P_{Width}$.

The pulse width data $P_{Width}$ is supplied to a PWM generator 402 which generates a corresponding pulse of the required width, in terms of the number of clock cycles of first clock signal CLK1.

In the embodiment of FIG. 4 however the pulse width data $P_{Width}$ is also supplied to a pulse position controller 403. The pulse position controller 403 receives the pulse width data $P_{Width}$ and determines a pulse position for the pulse in the cycle period. The pulse position controller 403 outputs pulse position data $P_{POS}$ for each cycle period to the PWM generator 402 which then generates a pulse of the required width as defined by $P_{Width}$ at a position in the cycle period as defined, at least partly, by the pulse position data $P_{POS}$.

The pulse position controller 403 effectively operates to try to position each pulse of a respective cycle to maintain a low overall positional error across several cycles. As noted above, for a PWM cycle period that is equal to an even number of clock cycles, a pulse having a width or duration that is also equal to an even number of clock cycles could be positioned without any positional error for that cycle, but some positional error, in a given cycle, would be inherent for a pulse of odd width. The pulse position controller 403 operates so as to try to reduce or minimise the overall error, across several cycles, by positioning pulses within a PWM cycle period to compensate for the positional error of previous cycles.

Thus, for example, if the PWM cycle period were equal to 8 clock cycles of the first clock signal CLK1 and in two successive PWM cycles the required pulse width is 3 clock cycles, the pulse in the first PWM cycle period could be positioned as illustrated by position (d) in FIG. 3, e.g. the pulse starts half a clock cycle earlier than the perfect symmetrical position, and the pulse in the second PWM cycle period could be positioned as illustrated by position (e) in FIG. 3, e.g. the pulse starts half a clock cycle later than the perfect symmetrical position, to compensate for the error.

In some implementations the pulse position controller 403 could be configured such that pulses, which have a width or duration (in terms of number of clock cycles) which is of the same parity as the PWM cycle period, are always positioned symmetrically so as to generate no positional error within the respective PWM cycle. Pulses of a width or duration of the opposite parity to the cycle period, in terms of number of clock cycles of the first clock signal CLK1, could then be controllably positioned to maintain a low overall positional error.

However a pulse having a width that means that it can't be positioned symmetrically in the PWM cycle period could, in use, be followed by a succession of cycles where the pulses can be all be positioned symmetrically and in such as case the positional error would not be compensated for over a useful timeframe.

It should also be noted that the amount of positional error varies with pulse width. For example, referring back to FIG. 3, consider the pulse illustrated at position (e). This is a continuous pulse of three clock cycles. However it could be considered as a first sub-pulse of two clock cycles occurring at the fourth and fifth clock cycles of the PWM cycle period, followed immediately by a second sub-pulse of one clock cycle, occurring at the sixth clock cycle of the PWM cycle period. The first sub-pulse is symmetric about the midpoint of the PWM cycle period and thus has no positional error associated with it. The time-voltage product of the second sub-pulse can be seen as equivalent to a certain amount of energy at a time equal to 5.5 clock cycles into the cycle period, so occurring 1.5 clock cycles after the midpoint of the PWM cycle period.

Now consider instead the pulse were to start one clock cycle earlier and end one clock cycle later. This would correspond to a pulse having a duration of five clock cycles, which pulse again starts half a clock cycle later than the ideal symmetric position. In this instance such a pulse could again be considered as a first symmetric sub-pulse, which in this case would now be four clock cycles in duration, followed by a second sub-pulse of one clock cycle. Again the first sub-pulse is symmetric and contributes no positional error, but in this case the energy of the second sub-pulse is centred on the seventh cycle period and thus occurs 2.5 cycle periods later than the midpoint of the PWM cycle period.

Thus the pulse illustrated in position (e) of FIG. 3 could be seen as having an error of magnitude of 1.5 (in terms of clock cycles) whereas a pulse having a duration of five clock cycles, but likewise started half a clock cycle after the symmetric position, would lead to a positional error of magnitude 2.5. The same would occur for pulses started too early, but the error may thought of as being of opposite polarity.

In general, any pulse could be divided into a first sub-pulse region which includes the maximum part of the pulse (if any) which is symmetric around the midpoint of the PWM cycle period and a second sub-pulse region comprises any remaining part of the pulse. If the pulse starts before the midpoint of the PWM cycle period and ends after the midpoint then at least part of the pulse can be defined as the first sub-pulse region and such region will either start at the same time as the pulse or end at the same time as the pulse—or both if the pulse is actually centred. If the pulse is not centred there will be at least part of the pulse which corresponds to the second sub-pulse region, which corresponds to the remaining part of pulse after as much of the symmetric part of the pulse has been identified. It is this second sub-pulse region that can be seen as providing the timing error and will be further away from the midpoint of the cycle period for longer duration pulses.

The pulse position controller 403 may thus control the position of both odd and even width pulses, i.e. pulses whose durations in terms of the number of clock cycles of the first clock signal CLK1 may be either odd or even. The pulse position controller 403 may control the position of a pulse which could possibly be positioned symmetrically so that the pulse is arranged in a non-symmetrical position in order to reduce the overall positional error. Thus, for example with reference to FIG. 3 the pulse position controller 403 may generate pulse position data $P_{POS}$ so that the PWM generator 402 generates a pulse of duration of four clock cycles at positions (b) or (c), rather than position (a), so as to reduce overall positional error.

Figure 5:
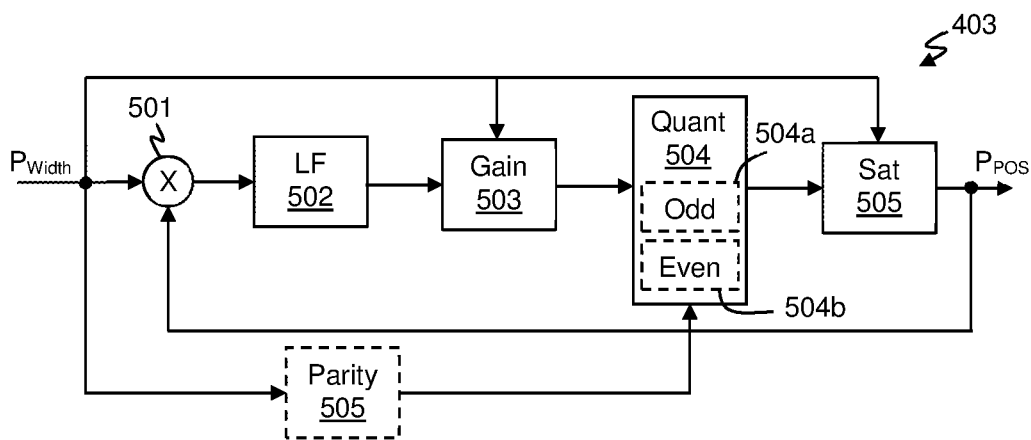
FIG. 5 illustrates one example of a suitable pulse position controller.

FIG. 5 illustrates one embodiment of a suitable pulse position controller 403. In this example the pulse position controller 403 outputs pulse position data $P_{POS}$ indicative of the amount of shift of the pulse position from the centred, symmetric position.

The received pulse width data $P_{Width}$ is multiplied, by multiplier 501, with a feedback signal derived from output pulse position data $P_{POS}$. As noted above the extent of positional error is related to the amount of timing error but also the width of the pulse. The output of the multiplier 501 therefore provides an indication of the positional error which is input to loop filter 502. The multiplier 501 thus acts as an error block for determining the positional error. The loop filter 502 effectively accumulates the amount of positional error. The loop filter 502 may be any suitable type of filter selected to provide a desired performance, as would be understood be one skilled in the art. For example the filter could be a second or higher order integrating filter, e.g. a third or fourth order filter, such as may be used for sigma-delta modulators or the like.

The output of the loop filter 502 is output to gain compensation block 503 which compensates for the multiplication by the pulse width $P_{Width}$ in the feedback loop to provide a constant gain. The gain compensation block 503 may, in some implementations, effectively divide the output of the loop filter 502 by a value proportional to the pulse width $P_{Width}$. This could be implemented by an actual divide function, but, as divides can be computationally expensive and as the number of possible pulse widths are limited, it may be advantageous to store a set of reciprocal values, e.g. values proportional to the reciprocal of the pulse width, in a look-up table or similar, and, based on the pulse width $P_{Width}$, select the appropriate reciprocal value for multiplication with the output of the loop filter 502.

The gain compensated positional error can then be input to quantizer 504 which selects any appropriate timing shift to be applied to the pulse so as to reduce the overall positional error. As noted above the timing shift data, i.e. the pulse position data $P_{POS}$ may be provided as an indication of the shift of the pulse compared to the ideal centred position. As also noted above, the possible shifts from the ideal centred position that can be implemented in practice will vary for odd and even width pulses.

Pulses where the pulse width, in terms of the number of clock cycles, is of the same parity as the cycle period, e.g. both even or both odd, can be correctly centred in the PWM cycle period (i.e. a shift of zero) or can be shifted from this ideal position by an integer number of clock cycles. Thus for a pulse width of the same parity as the PWM cycle period, the quantizer 504 may be configured to output shift values which are integers, i.e. zero or a non-zero positive or negative integer. As noted a value of zero may indicate no timing shift and for a non-zero value the polarity, positive or negative, may indicate the relative timing shift, e.g. early or late respectively or vice versa.

For a pulse width, in terms of the number of clock cycles, of the opposite parity to the cycle period, the quantizer 504 may be configured to output values equal to any half-integer, i.e. value of x/2 where x is any positive or negative odd integer. Such pulse cannot be centred correctly in a PWM cycle period and thus some timing shift from the ideal centred position will always occur.

Figure 6:
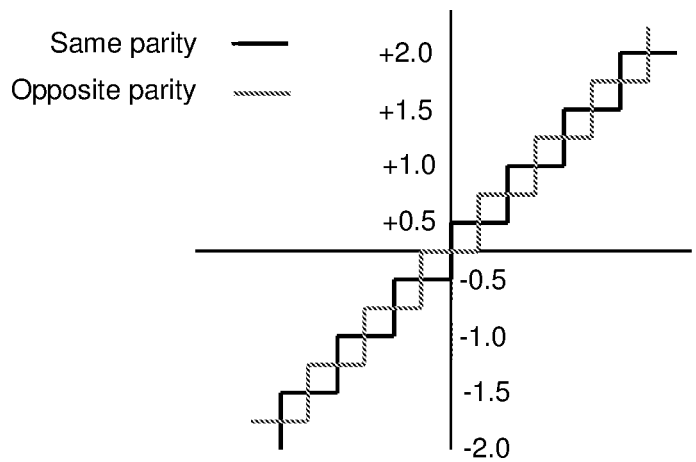
FIG. 6 illustrates one example of a quantizer characteristic.

FIG. 6 illustrates one example of the characteristics of quantizer 504 in terms of possible output quantization levels. In some instances the quantizer 504 may be responsive to a parity monitor 505 that determines the parity of the pulse, in terms of whether the pulse duration corresponds to an odd or even number of clock cycles of the first clock signal CLK1, by looking at the value of least significant bit of the pulse width data $P_{Width}$ for each cycle. If the pulse width data is odd the quantizer may select from a first set of output values and if the pulse width data is even the quantizer may select from a second set of output values. In some examples the quantizer 504 may comprise separate odd and even quantizers 504a and 504b that operate with the first and set of output values respectively. The relevant quantizer may be selected for use based on the parity of the pulse width data or the quantizers may operate in parallel and the output of the relevant quantizer may be selected based on the indication of parity from the parity monitor 505.

The output from the quantizer 504 is thus an indication of the desired timing shift from the ideal centred position for the pulse of the present PWM cycle period that minimises the overall positional error.

In some instances the output of the quantizer 504 may be input into a saturation controller 505. The saturation controller 505 may, in effect, ensure that the amount of time shifting applied is appropriate and, if necessary, limit the amount of time shifting applied. It will be understood that the amount by which a pulse may be shifted within the cycle period will depend on the pulse width. Thus, for example if a pulse has a duration that is only one clock cycle shorter than the overall cycle period, there are only two possible positions for the pulse, i.e. the pulse starts at the beginning of the PWM cycle period and ends one clock cycle before the end, or the pulse starts one clock cycle into the PWM cycle period and stops at the end of the PWM cycle period. However a pulse that is only one clock cycle in duration could, in theory be positioned anywhere from the first clock cycle of the PWM cycle period to the last clock cycle.

The saturation controller 505 may therefore limit the magnitude of pulse shift value $P_{POS}$ based on the pulse width $P_{Width}$ to avoid shifting the pulse by an amount greater than required. The feedback of the pulse position data $P_{POS}$ is tapped from after the saturation controller so that the positional error fed-back to the loop filter 502 is based on the pulse position actually implemented.

The pulse position controller 403 as illustrated in FIG. 5 effectively applies noise shaping to the pulse position, i.e. the position of the edges of the pulses of the PWM signal. The pulse position controller 403 can thus be seen as an edge-position shaper.

Figure 7:
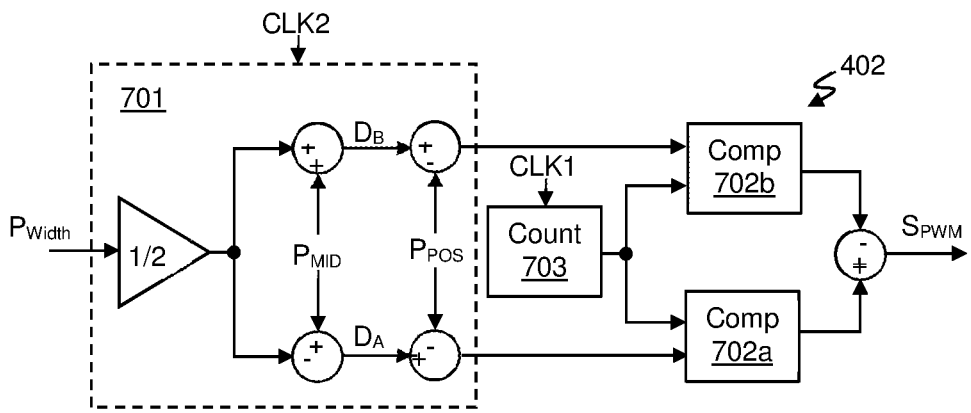
FIG. 7 illustrates one example of a PWM generator.

The pulse position data $P_{POS}$, which in the example described above may be an indication of the extent of the shift if any, of the pulse from a centred position, e.g. a desired shift in the position of the edges of the pulse, is provided to the PWM generator 402. The PWM generator 402 then generates an appropriately positioned pulse within the PWM cycle period. FIG. 7 illustrates one example of a suitable PWM generator 402. The pulse width data $P_{Width}$ is received by a threshold block 701 and used to derive at least one threshold value based on the required pulse width. In this example upper and lower threshold values $D_A$ and $D_B$ are defined to represent the values, in terms of clock cycles of the first clock signal CLK1, at which the pulse should be started and stopped respectively to provide a pulse of the required width centre in the PWM cycle period. Thus for example the required pulse width value $P_{Width}$ may be halved, and the resultant value subtracted from the value, $P_{MID}$ corresponding to the midpoint of the PWM cycle to provide the threshold value $D_A$ and added to the value $P_{MID}$ to provide the threshold value $D_B$. Where the PWM cycle period had a duration equal to an even number of clock cycles of the first clock signal, the value $P_{MID}$ will be an integer. In which case if the duration of the pulse is also an even number of clock cycles the threshold values $D_A$ and $D_B$ will both be integer. However if the duration of the pulse is an odd number of clock cycles the half value will be half-integer and the resultant threshold values will also be half-integer. Were however the duration of PWM cycle period to be equal to an odd number of clock cycles, then the value $P_{MID}$ would be half integer. In which case pulse durations of an odd number of clock cycles would lead to integer values for the threshold values $D_A$ and $D_B$ and pulse widths of an even number of clock cycle would lead to half-integer values. Thus if the pulse width and the PWM cycle period do have the same parity, in terms of the number of clock cycles, the thresholds will be integer, otherwise if the parity is different the thresholds will be half-integer.

These threshold values corresponding to the centred pulse position are both then shifted by an amount defined to the pulse position data $P_{POS}$. As mentioned above this value represents the amount of time shift desired from the centred position and the pulse position data $P_{POS}$ will itself be half-integer if the durations of the pulse and the PWM cycle period are of opposite parity to one another in terms of the number of clock cycles. The threshold values $D_A$ and $D_B$ are each shifted in the same direction, e.g. the pulse position data $P_{POS}$ value is subtracted from both threshold values $D_A$ and $D_B$ (if a positive polarity of pulse position data $P_{POS}$ is desired to provide an earlier pulse position, otherwise the pulse position data $P_{POS}$ may be added to both threshold values). This provides the required shift of the pulse position without any impact on the pulse width. The adjusted threshold values, i.e. the edge shaped threshold values $D_{AS}$ and $D_{BS}$ are then used to define when to start and stop the pulse within the PWM cycle period.

In this example the edge shaped threshold values $D_{AS}$ and $D_{BS}$ are provided to comparators 702a and 702b respectively each of which receive a count value from counter 703. The counter 703 is clocked by the first clock signal CLK1 and may respectively increment from a count value of zero to a value of N, equal to the number of clock cycles for the PWM cycle period, before resetting to zero. The comparators 702a and 702b output a value of logic 0 unless the count value is equal to or greater than the respective threshold value $D_{AS}$ or $D_{BS}$. The output from comparator 702b is subtracted from the output of comparator 702b to form the PWM signal $S_{PWM}$. At the start of the PWM cycle, the count value is zero. Unless the lower threshold value is equal to zero, the output of both comparators 702a and 702b will thus be logic 0. The count value then increments until the value of the lower threshold $D_{AS}$ is reached, at which point the output of comparator 702a goes to logic 1. Unless the threshold $D_{BS}$ is equal to $D_{AS}$, indicating a duty cycle of zero, the output of comparator 702b will be logic 0 and thus the PWM signal $S_{PWM}$ will become logic 1 at this point. The count value will increase until the higher threshold $D_{BS}$ is reached and both comparators 702a and 702b have outputs of logic 1, in which case the PWM signal $S_{PWM}$ drops back to logic 0.

It will be understood this arrangement means that only the counter 703 and comparators 702a and 702b operate at the relatively fast clock rate of the first clock signal and the threshold block 702 may operate at the slower speed of the second clock signal CLK2, e.g. at the PWM cycle frequency $F_{CYC}$. It will also be appreciated that this is just one example of a suitable PWM generator 402 and many variants are possible.

In the examples illustrated in FIGS. 5 and 7 the pulse position controller 403 outputs pulse position data $P_{POS}$ in terms of an edge shift desired for the pulse from the centred position. This is just one example however and the pulse position controller could be arranged to provide pulse position data in other formats, for instance the pulse position controller 403 could output an indication of the clock cycle in the PWM cycle period at which the pulse should start and/or stop. Thus the pulse position controller 403 could for instance output an indication of the relevant upper or lower threshold value. The PWM generator 402 could then start the pulse at the relevant clock cycle and maintain the pulse for the required duration as indicated by the pulse width data $P_{Width}$.

Figure 8:
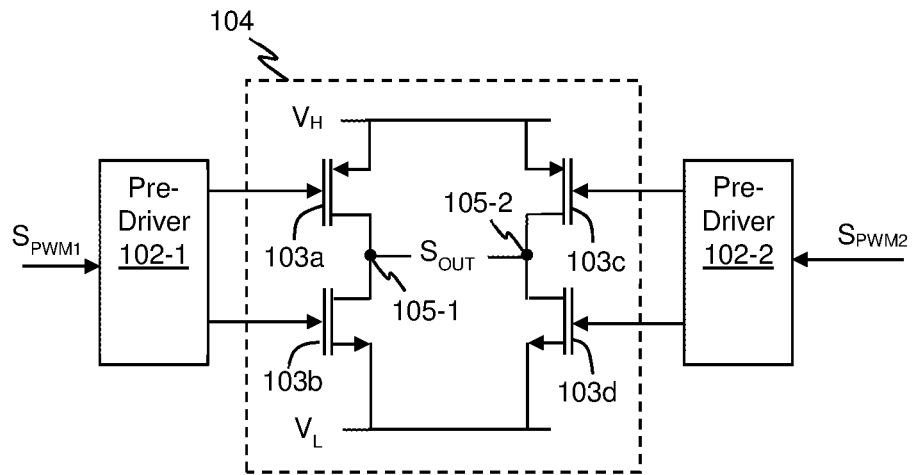
FIG. 8 illustrates one example of a full bridge output stage for a Class-D amplifier.

As discussed above, a PWM modulator according to embodiments of the disclosure may be used as part of a Class-D amplifier, such as the amplifier described with respect to FIG. 1. The Class-D amplifier shown in FIG. 1 has a half-bridge output stage but some implementations of Class-D amplifiers use an output stage with a full bridge arrangement. FIG. 8 illustrates one example of an output stage 104 of a Class-D amplifier implemented in a full bridge arrangement. In this example the output stage 104 has a first branch comprising switches 103a and 103b connected in series between $V_H$ and $V_L$ with an output node 105-1 in a similar manner as discussed above, but the output stage also includes a second branch comprising switches 103c and 103d also connected in series between the voltage rails $V_H$ and $V_L$ and with a second output node 105-2. The output signal $S_{OUT}$ is a differential signal that is tapped from the first and second output nodes 105-1 and 105-2 and may, for instance, be used to drive a bridge-tied load. The switches 103a and 103b of the first branch may be driven, via a first pre-driver 102-1, by a first PWM signal $S_{PWM1}$. The switches 103c and 103d of the second branch may be driven, via a second pre-driver 102-2, by a second PWM signal $S_{PWM2}$.

Figure 9A:
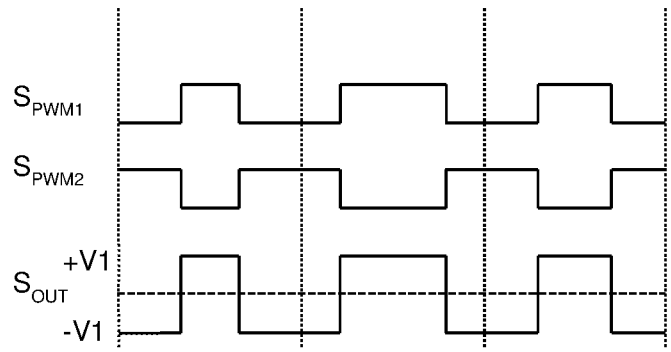
FIGS. 9a and 9b illustrate two examples of modulation schemes for a full-bridge output stage.

In some instances the output stage may be driven so that both output branches switch state at the same time as one another, with the switches 103a and 103b of the first branch being switched in an antiphase fashion relative to the corresponding switches 103c and 103c of the second branch. Such a modulation scheme is often referred to as AD modulation. Thus the second PWM signal, $S_{PWM2}$ is effectively the inverse of the first PWM signal $S_{PWM1}$ as illustrated in FIG. 9a. FIG. 9a illustrates three PWM cycles of the PWM signals. The first PWM signal $S_{PWM1}$ may be a PWM signal such as described above, with a pulse of a first state centred, as far as possible, in the PWM cycle period and the rest of the cycle period comprising the second output state. The second PWM signal $S_{PWM2}$ is the inverse of the first PWM signal $S_{PWM1}$. The resultant output signal $S_{OUT}$ is the difference between the voltages at the two output nodes 105-1 and 105-2. Such an arrangement allows the output signal to have a greater voltage swing. For example if the voltage difference between the high and low voltages $V_H$ and $V_L$ is equal to a magnitude of V1, the output signal may vary between +V1 and −V1, i.e. a swing of magnitude twice V1. This may also allow a bipolar output signal to be generated from a unipolar supply. For instance if the high rail $V_H$ is equal to a positive voltage V1 and the low voltage rail $V_L$ is at ground, the output signal (ignoring losses) will alternate between +V1 and −V1.

Figure 9B:
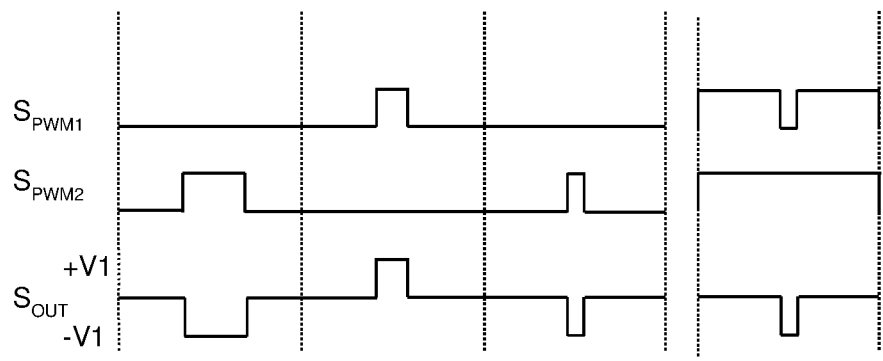

Alternatively a full-bridge output stage could be driven such that the switches of the first branch may switch at different times to the switches of the second branch. This is often referred to as BD modulation. This allows the output signal to have a zero differential voltage when both branches are switched to connect the output nodes 105-1 and 105-2 to the same voltage rail. FIG. 9b illustrates an example of BD modulation. Again three successive PWM cycles are illustrated. FIG. 9b illustrates that the first and second PWM signals $S_{PWM1}$ and $S_{PWM2}$ may be arranged so that both output nodes 105-1 and 105-2 may remain at the same voltage for at least part of the cycle so there is at least one period of zero voltage in the output signal $S_{OUT}$ with the branches also being switched to opposite rails to provide positive or negative voltage pulses in the output signal $S_{OUT}$ as desired. This can be more efficient than AD modulation. Note that with BD modulation there are two possible ways in which the zero voltage output may be implemented: both output nodes 105-1 and 105-2 may be connected to the high voltage rail $V_H$ or both may be connected to the low voltage rail $V_L$. The first three PWM cycles illustrated in FIG. 9b illustrated the zero voltage output being implemented by both output nodes connected to the low voltage rail $V_L$. However FIG. 9b also illustrates as a separate fourth PWM cycle, how the same output signal $S_{OUT}$ as the third PWM cycle could be implemented by using the alternative zero state (with both outputs connected to the high voltage rail $V_H$) by simply inverting both the first and second PWM signals $S_{PWM1}$ and $S_{PWM2}$. In some BD modulations schemes the zero state used may be controllably alternated to maintain a desired overall common-mode voltage as will be understood by one skilled in the art.

Figure 10A:
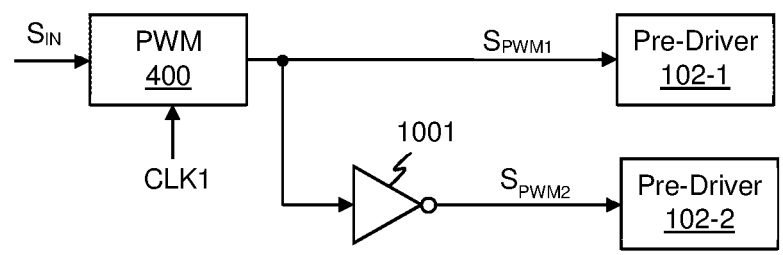
FIGS. 10a and 10b illustrate two implementations of the use of PWM modulators for driving a full-bridge output stage.

Embodiments of the present disclosure may be used as part of a Class-D amplifier with a full bridge output stage. FIG. 10a for example illustrates one example of part of a Class-D amplifier chain for driving a full bridge output stage in an AD modulation scheme. A PWM modulator 400 such as described above is used to generate a PWM signal with pulses having controlled positions which is used as the first PWM signal $S_{PWM1}$. This signal is inverted by inverted 1001 to provide the second PWM signal $S_{PWM2}$. The PWM modulator 400 corrects for any positional error in the first PWM signal $S_{PWM1}$, and hence also the second PWM signal $S_{PWM2}$.

Figure 10B:
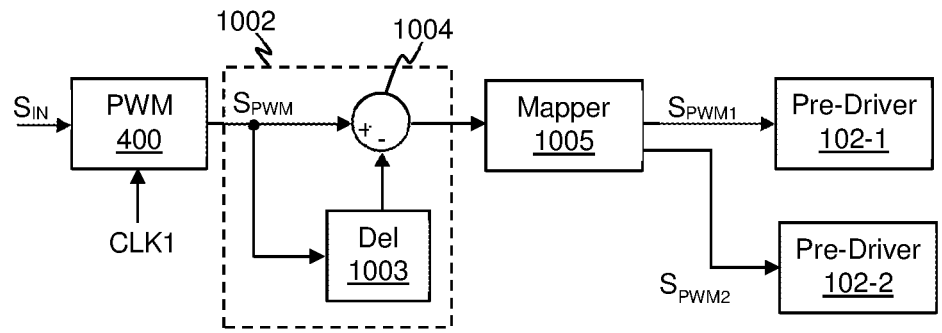

FIG. 10b illustrates one example of part of a Class-D amplifier chain for driving a full bridge output stage in a BD modulation scheme. In this example a PWM modulator 400 such as described above is used to generate a PWM signal with pulses having controlled positions. This PWM signal is input into a remodulator 1002 which in effect converts the two-state PWM signal $S_{PWM}$, which can be seen as varying between two states +1 and −1, into a three state signal that varies between states +1, 0 and −1. In this example the remodulator 1002 is implemented by a comb filter comprising a delay 1003 and combiner 1004. This three state signal may be input to a mapper 1005 which may map the three state signal into the required first and second PWM signals $S_{PWM1}$ and $S_{PWM2}$. As noted above the mapper 1005 may be implemented to provide some control over the zero states used for common mode control, for instance by alternating the zero state used on a cycle-by-cycle basis.

It will be noted that the BD modulation illustrated with respect to FIG. 9b is only one example and different variants exists. For instance the zero state used may be varied within a cycle if control over the common mode at an update rate faster than the PWM cycle frequency is required.

Figure 11:
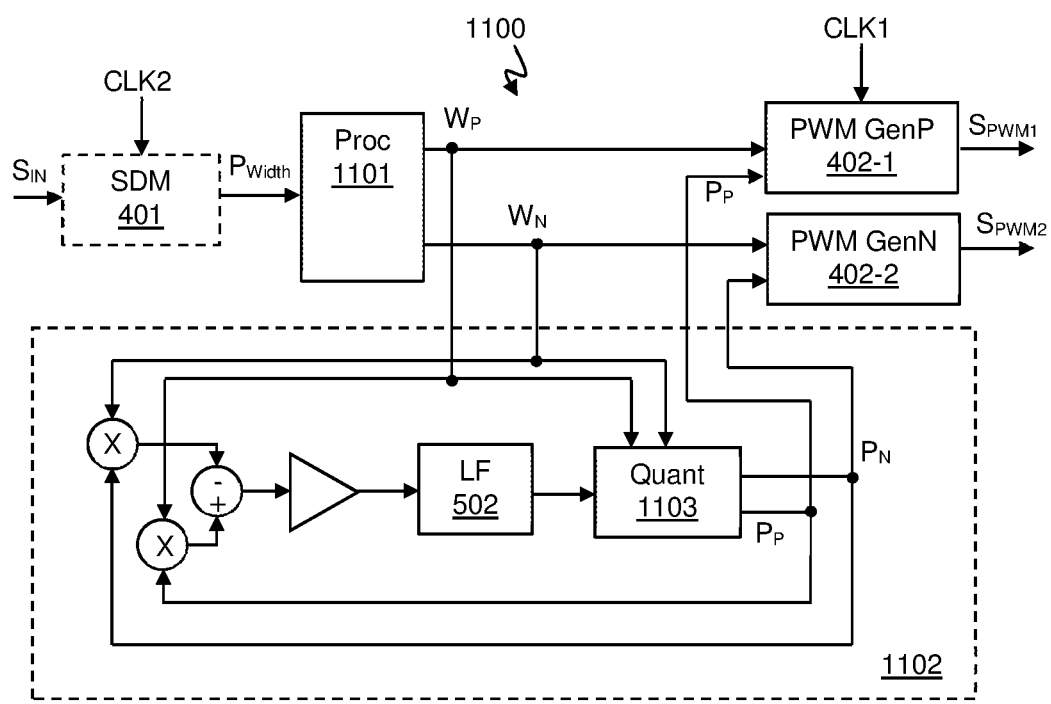
FIG. 11 illustrates a PWM modulator according to another embodiment.

In some embodiments the PWM modulator may be configured to generate the first and second PWM signals $S_{PWM1}$ and $S_{PWM2}$ and control the position of pulses in each PWM signal. FIG. 11 illustrates an embodiment of a PWM modulator 1100. In this example the input signal $S_{IN}$ may be processed by SDM 401 as discussed above to provide a signal indicative of the desired signal level. This pulse width signal may be input to processing block 1101 to determine individual pulse widths for each branch of the output stage, i.e. effectively a desired width $W_P$ of a pulse for the positive side branch and a desired width $W_N$ of a pulse for the negative side branch. In some embodiments the processing block may effectively split the pulse width value $P_{Width}$ into two, apply any floor and ceiling limits, invert the value for the negative side branch and add the resultant values to a value corresponding to a 50% duty cycle. These individual pulse widths are supplied to individual PWM generators 402-1 and 402-2 as the required pulse widths for the first and second PWM signals $S_{PWM1}$ and $S_{PWM2}$. The pulse positions are determined by a pulse position controller 1102, which in this example receives the two pulse width values $W_P$ and $W_N$ and determines positions for both pulses that collectively reduces or compensates for any positional error. The pulse position controller determines and accumulates the extent of any positional error and then determines a position that minimises the overall error in a similar manner as discussed above. In this example however the individual errors of the positive and negative pulses are determined and subtracted to give an overall positional error which is input to the loop filter 502. In this example the quantizer 1103 is a vector quantizer which receives an indication of the overall error and the required pulse widths.

The quantizer may operate in various ways. In practice one pulse width $W_P$ or $W_N$ may be greater than the other and the quantizer may vary the position of the smaller, i.e. narrower, pulse only. In some embodiments the quantizer may be operable to vary the position of both pulses, either in the same direction or in opposite directions. The required pulse positions $P_P$ and $P_N$ are output to the respective PWM generators 401-1 and 402-1 which each may operate as described above with reference to FIG. 7.

A PWM modulator as described in embodiments of the disclosure thus provides a digital implementation with the size and power advantages thereof, especially at smaller geometry process nodes. The pulses of the PWM signal are thus quantized in time by being synchronised to the first clock signal. The PWM modulator allows generation of pulses of both an odd and an even number of clock cycles of the first clock signal and thus can utilise all the available resolution for a given clock frequency of the first clock signal and desired PWM cycle period. The issues of the positional error that arises through use of both pulses of odd and even number of clock cycles is mitigated by monitoring the positional error and controlling the position of a pulse based on the error arising from one or more previous pulses so as to reduce the overall positional error.

Note as used herein the term clock cycle refers to the part of the clock signal used to define the minimum time period. This may in some embodiments be the part of the signal between successive rising edges of the clock signal or successive falling edges. In some instances however the minimum period may be defined between any successive edges e.g. between a rising edge and a falling edge and then between that falling edge and the next rising edge and thus such a period shall be seen as the clock cycle.

A digital PWM modulator 200 such as described may be used in a variety of different applications. As described previously one application may be as a digital PWM modulator 101 for a Class-D amplifier such as described with respect to FIG. 1 or variants thereof. Such a Class-D amplifier may be used as a driver for a transducer, for example an audio transducer such as a loudspeaker and the PWM modulator may therefore be arranged as part of an audio playback path. The Class-D amplifier may be implemented in a host device and in some instances may be operable to drive a transducer of the host device. Additionally or alternatively in some embodiments the Class-D amplifier may be operable to drive a transducer of some peripheral or accessory apparatus that may be removably connected to the host device in use, for instance by some suitable mating connector such as a jack-and-socket arrangement or some other plug-and-receptacle connector such as a USB connection which may be rotationally symmetric, e.g. a USB-C connector or lightening connector or similar. Note that as used herein the term audio is not restricted to the audible frequency band, e.g. a band of a few Hz to about 20 kHz. Whilst the PWM modulator may be used as part of a playback path for audible frequency band signals the PWM modulator may additionally or alternatively be used for other frequency band signals, e.g. to drive ultrasonic transducers and/or to drive haptic transducers.

The PWM modulator may be implemented as at least part of an integrated circuit, e.g. a codec or the like.

Whilst the PWM modulator is useful for Class-D amplifier circuits there are other applications where a digital PWM signal with a reduced timing error may be advantageously used and the disclosure is not limited to Class-D applications and should be taken as encompassing any application where a symmetric digital PWM signal may be useful.

As used here the terms pulse width and pulse duration shall be taken to mean the same as one another. The term parity and the terms odd and even when used in the context of pulse width shall refer to the number of clock cycles of a clock signal corresponds to such a pulse width.

Note that as used herein the term "module" shall be used to refer to a functional entity or component and the functional entity may be implemented at least partly by dedicated hardware components such as custom defined circuitry and/or at least partly be implemented by one or more software processors or appropriate code running on a suitable processor, which may be a general purpose processor or the like. Any circuitry components or software processes forming part of one module may be shared with another module and/or the same processor may implement multiple modules. A particular module may itself comprise component modules. The components forming at least part of one module may be co-located with one another, or implemented by the same processor, or may be spatial separated or implemented by different processes on different processors. The term "block" shall be given the same meaning as the term module.

The skilled person will thus recognise that some aspects of the above described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments of the present invention will be implemented on a DSP (Digital Signal Processor), ASIC (Application Specific Integrated Circuit) or FPGA (Field Programmable Gate Array). Thus the code may comprise conventional program code or microcode or, for example, code for setting up controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communications with one another. Where appropriate, the embodiments may also be implemented using code running on a field-(re)programmable analogue array or similar device in order to configure analogue hardware.

Embodiments of the present disclosure may be implemented in an electronic device. The electronic device may be at least one of: a portable device; a battery powered device; a communication device; a mobile or cellular telephone or a smartphone; a computing device; a laptop, notebook or tablet computer; a gaming device; a wearable device; a voice controlled device.

It should be noted that the above-mentioned embodiments illustrate rather than limit the invention, and that those skilled in the art will be able to design many alternative embodiments without departing from the scope of the appended claims. Unless expressly stated otherwise features described with reference to one embodiment may be used in combination with features described with respect to any of the other embodiments. The word "comprising" does not exclude the presence of elements or steps other than those listed in the claim, "a" or "an" does not exclude a plurality, and a single feature or other unit may fulfill the functions of several units recited in the claims. Any reference numerals or labels in the claims shall not be construed so as to limit their scope. Terms such as amplify or gain include possible applying a scaling factor or less than unity to a signal.

The invention claimed is:

1. A PWM (pulse-width-modulation) modulator comprising:
   a PWM generator configured to receive pulse width data and to output a PWM signal comprising a plurality of repeating PWM cycle periods, in which the duration of any pulse of the PWM signal in each PWM cycle period is based on the pulse width data,
   wherein the PWM generator is configured to receive a first clock signal and to synchronise the PWM cycle periods and the start and end of any pulse of the PWM signal to the first clock signal;
   wherein the PWM generator is operable to generate pulses that have a positional error from a centred position within the PWM cycle period;
   wherein the pulse-width modulator comprises a pulse position controller configured to control the position of a pulse in a PWM cycle period so as to at least partly compensate for the positional error of one or more preceding pulses;
   wherein the pulse position controller is configured to receive the pulse width data and comprises:

an error block for determining a positional error for a pulse based on the pulse width data;

a loop filter for filtering the positional error; and a quantizer configured to output pulse position data for controlling the position of the pulse in the PWM cycle period based on the output of the loop filter, wherein the pulse position data comprises data indicating a shift in pulse position from the centred position within the PWM cycle period, wherein the error block comprises a multiplier for multiplying a feedback signal of the pulse position data with the pulse width data to generate the positional error.

2. A PWM modulator as claimed in claim 1 wherein the pulse position controller further comprises a gain compensation block configured to apply gain compensation to the output of the loop filter to compensate for the variable pulse width.

3. A PWM modulator as claimed in claim 2 wherein the gain compensation block comprises a store of a set of reciprocal values proportional to the reciprocals of the possible pulse widths and the gain compensation block is configured to multiply the output of the loop filter with an appropriate reciprocal value based on the pulse width data.

4. A PWM modulator as claimed in claim 1 wherein the loop filter comprises a second or higher order integrating filter.

5. A PWM modulator as claimed in claim 1 wherein the quantizer is configured to select from a first set of output values when the pulse width data is odd and select from a second set of output values when the pulse width data is even wherein one of the first and second set of output values comprises a set of integers and the other of the first and second set of output values comprises a set of half-integers.

6. A PWM modulator as claimed in claim 5 wherein the pulse position controller comprises a parity monitor for determining whether the pulse width data is odd or even from a least significant bit of the pulse width data wherein the quantizer is responsive to the parity monitor.

7. A PWM modulator as claimed in claim 1 wherein the pulse position controller comprises a saturation controller configured to apply a limit to the output of the quantizer based on the pulse width data so as to limit the start and end of the pulse within the PWM cycle period.

8. A PWM modulator as claimed in claim 1 wherein the pulse position controller is configured to output pulse position data to the PWM generator and wherein the PWM generator is configured to generate the pulse in the PWM cycle period at a position based on the pulse position data and for a duration based on the pulse width data.

9. A PWM modulator as claimed in claim 8 wherein the PWM modulator comprises:

a threshold generator for generating first and second threshold values based on the pulse width data and the pulse position data;

a counter clocked by said first clock signal to generate a count value; and at least one comparator responsive to said first and second threshold values and said count value to determine when to start and stop a pulse within the PWM cycle period.

10. A PWM modulator as claimed in claim 1 further comprising a sigma delta modulator for receiving an input signal and converting the input signal to said pulse width data.

11. A PWM modulator as claimed in claim 1 comprising circuitry for receiving the PWM signal from the PWM generator and deriving first and second PWM signals providing a differential output.

12. A PWM modulator as claimed in claim 1:

wherein the PWM generator is configured to receive first and second pulse width data and to output respective first and second PWM signals;

wherein the error block is configured to determine pulse positional error based on the first width data and second pulse width data; and wherein the quantizer is a vector quantizer configured to output first pulse position data for the controlling the position of a pulse in the PWM cycle period of the first PWM signal and second pulse position data for the controlling the position of a pulse in the PWM cycle period of the second PWM signal.

13. A Class-D amplifier circuit comprising a PWM modulator as claimed in claim 1 and an output stage controlled by the PWM signal.

14. A Class-D amplifier circuit as claimed in claim 13 wherein the output stage is a full-bridge output stage.

15. A PWM modulator operable to generate a digital PWM signal wherein signal transitions in the PWM signal are synchronised to a first clock signal, wherein the PWM modulator comprises a pulse position controller configured to monitor any positional error arising from pulses in a PWM cycle period not being centred within the PWM cycle period and to control the position of a pulse in a subsequent PWM cycle period to compensate for said error;

wherein the pulse position controller is configured to receive pulse width data and comprises:

an error block for determining the positional error for a pulse based on the pulse width data;

a loop filter for filtering the positional error; and a quantizer configured to output pulse position data for controlling the position of the pulse in the subsequent PWM cycle period based on the output of the loop filter, wherein the pulse position data comprises data indicating a shift in pulse position from the centred position within the PWM cycle period; and wherein the error block comprises a multiplier for multiplying a feedback signal of the pulse position data with the pulse width data to generate the positional error.

16. A pulse position controller for controlling the position of a pulse of a PWM signal in a PWM cycle period, the pulse position controller being configured to receive pulse width data and comprising:

an error block for determining a positional error for a pulse based on the pulse width data;

a loop filter for filtering the positional error; and a quantizer configured to output pulse position data for the controlling the position of the pulse in the PWM cycle period based on the output of the loop filter;

wherein the pulse position data comprises data indicating a shift in pulse position from the centred position within the PWM cycle period; and wherein the error block comprises a multiplier for multiplying a feedback signal of the pulse position data with the pulse width data to generate the positional error.

17. A digital PWM pulse generator comprising:

a first input for receiving pulse width data;

a second input for receiving pulse position data;

a clock input for receiving a first clock signal;

an output for outputting a PWM signal comprising a series of pulses in PWM cycle periods, where PWM cycle period and the start and end of the pulses are synchronised to the first clock signal;

wherein the duration of a pulse in a PWM cycle period is defined by the pulse width data and the position of the pulse in the PWM cycle period is defined by the pulse position data;

wherein the digital PWM pulse generator is configured to receive first and second pulse width data and to output respective first and second PWM signals.

18. A PWM (pulse-width-modulation) modulator comprising:

a PWM generator configured to receive pulse width data and to output a PWM signal comprising a plurality of repeating PWM cycle periods, in which the duration of any pulse of the PWM signal in each PWM cycle period is based on the pulse width data, wherein the PWM generator is configured to receive a first clock signal and to synchronise the PWM cycle periods and the start and end of any pulse of the PWM signal to the first clock signal;

wherein the PWM generator is operable to generate pulses that have a positional error from a centred position within the PWM cycle period;

wherein the pulse-width modulator comprises a pulse position controller configured to control the position of a pulse in a PWM cycle period so as to at least partly compensate for the positional error of one or more preceding pulses;

wherein the pulse position controller is configured to output pulse position data to the PWM generator and wherein the PWM generator is configured to generate the pulse in the PWM cycle period at a position based on the pulse position data and for a duration based on the pulse width data; and wherein the PWM modulator comprises:

a threshold generator for generating first and second threshold values based on the pulse width data and the pulse position data;

a counter clocked by said first clock signal to generate a count value; and at least one comparator responsive to said first and second threshold values and said count value to determine when to start and stop a pulse within the PWM cycle period.

19. A PWM (pulse-width-modulation) modulator comprising:

a PWM generator configured to receive pulse width data and to output a PWM signal comprising a plurality of repeating PWM cycle periods, in which the duration of any pulse of the PWM signal in each PWM cycle period is based on the pulse width data, wherein the PWM generator is configured to receive a first clock signal and to synchronise the PWM cycle periods and the start and end of any pulse of the PWM signal to the first clock signal;

wherein the PWM generator is operable to generate pulses that have a positional error from a centred position within the PWM cycle period;

wherein the pulse-width modulator comprises a pulse position controller configured to control the position of a pulse in a PWM cycle period so as to at least partly compensate for the positional error of one or more preceding pulses;

wherein the pulse position controller is configured to receive the pulse width data and comprises:

an error block for determining a positional error for a pulse based on the pulse width data;

a loop filter for filtering the positional error; and a quantizer configured to output pulse position data for the controlling the position of the pulse in the PWM cycle period based on the output of the loop filter, wherein the PWM generator is configured to receive first and second pulse width data and to output respective first and second PWM signals;

wherein the error block is configured to determine pulse positional error based on the first width data and second pulse width data; and wherein the quantizer is a vector quantizer configured to output first pulse position data for the controlling the position of a pulse in the PWM cycle period of the first PWM signal and second pulse position data for the controlling the position of a pulse in the PWM cycle period of the second PWM signal.

* * * * *